(12) United States Patent
Deng et al.

(10) Patent No.: US 11,471,967 B2
(45) Date of Patent: Oct. 18, 2022

(54) WIRE FIXATION APPARATUS AND SOLDERING METHOD

(71) Applicants: Tyco Electronics (Shanghai) Co. Ltd., Shanghai (CN); Measurement Specialties (China) Ltd., Shenzhen (CN); Shenzhen AMI Technology Co., Ltd., Shenzhen (CN)

(72) Inventors: Yingcong Deng, Shanghai (CN); Jeffrey Rochette, Shenzhen (CN); Qiyu Cai, Shenzhen (CN); Yang Zhou, Shenzhen (CN); Wenzhao Liao, Shenzhen (CN); Yumin Lan, Shenzhen (CN); Yanbing Fu, Shenzhen (CN); Yun Liu, Shanghai (CN); Dandan Zhang, Shanghai (CN); Qinglong Zeng, Shenzhen (CN)

(73) Assignees: Tyco Electronics (Shanghai) Co. Ltd., Shanghai (CN); Measurement Sepcialties (China) Ltd., Shenzhen (CN); Shenzhen Ami Technology Co. Ltd., Shenzhen (CN)

(*) Notice: Subject to any disclaimer, the term of this patent is extended or adjusted under 35 U.S.C. 154(b) by 486 days.

(21) Appl. No.: 16/713,185

(22) Filed: Dec. 13, 2019

(65) Prior Publication Data

US 2020/0114447 A1 Apr. 16, 2020

Related U.S. Application Data

(63) Continuation of application No. PCT/EP2018/065650, filed on Jun. 13, 2018.

(30) Foreign Application Priority Data

Jun. 14, 2017 (CN) .......................... 201710449806.2

(51) Int. Cl.
  *H05K 3/34* (2006.01)
  *B23K 1/20* (2006.01)
  *B23K 1/00* (2006.01)

(52) U.S. Cl.
  CPC .............. *B23K 1/20* (2013.01); *B23K 1/0016* (2013.01); *H05K 3/34* (2013.01); *H05K 2203/0165* (2013.01); *H05K 2203/0195* (2013.01)

(58) Field of Classification Search
  CPC .... B23K 1/20; B23K 1/0016; B23K 2101/38; B23K 37/0435; B23K 1/00; B23K 31/02;
  (Continued)

(56) References Cited

U.S. PATENT DOCUMENTS

| 5,655,284 A * | 8/1997 | Ferrill ................... H01R 43/01 29/755 |
| 7,299,541 B2 * | 11/2007 | Ikeda ..................... H01R 43/20 29/736 |

(Continued)

FOREIGN PATENT DOCUMENTS

| JP | 11104820 A | 4/1999 |
| WO | 2012072968 A1 | 6/2012 |

OTHER PUBLICATIONS

PCT Notification, The International Search Report and the Written Opinion of the International Searching Authority, Intl App No. PCT/EP2018/065650, dated Nov. 20, 2018, 11 pages.

(Continued)

*Primary Examiner* — Donghai D Nguyen
(74) *Attorney, Agent, or Firm* — Barley Snyder

(57) ABSTRACT

A fixation apparatus includes a base, a wire fixing device mounted on the base, and a pressing device mounted on the base. The wire fixing device positions and fixes a wire on a circuit board and includes a fixing frame mounted on the (Continued)

base and a moving unit received in a receiving chamber of the fixing frame. The fixing frame has a first positioning groove. The moving unit is movable between a clamping position and a release position and has a second positioning groove coupled with the first positioning groove. The wire is inserted into a wire insertion hole in the circuit board between the first positioning groove and the second positioning groove when the mobile unit is moved to the release position. The wire is clamped and fixed between the first positioning groove and the second positioning groove when the moving unit is moved to the clamping position.

18 Claims, 5 Drawing Sheets

(58) Field of Classification Search
CPC .. B23K 37/04; H05K 3/34; H05K 2203/0165; H05K 2203/0195; H05K 3/30; H05K 3/32; H05K 3/3447; Y10T 29/49147; Y10T 29/53209; Y10T 29/53243; Y10T 29/53261
USPC .................................. 29/842, 747, 755, 759
See application file for complete search history.

(56) References Cited

U.S. PATENT DOCUMENTS 9,827,635 B2 * 11/2017 Wu ..................... H05K 3/0008
2012/0168414 A1 7/2012 Kim

OTHER PUBLICATIONS

Abstract of JP11104820, dated Apr. 20, 1999, 4 pages.

* cited by examiner

WIRE FIXATION APPARATUS AND SOLDERING METHOD

CROSS-REFERENCE TO RELATED APPLICATIONS

This application is a continuation of PCT International Application No. PCT/EP2018/065650, filed on Jun. 13, 2018, which claims priority under 35 U.S.C. § 119 to Chinese Patent Application No. 201710449806.2, filed on Jun. 14, 2017.

FIELD OF THE INVENTION

The present invention relates to a fixation apparatus and, more particularly, to a fixation apparatus for fixing a wire to a circuit board.

BACKGROUND

In manufacturing an electronic device, it is often necessary to solder a wire onto a circuit board. In order to ensure soldering quality, it is usually required to insert the wire centrally into a wire insertion hole in the circuit board, and then to solder the wire to the circuit board with a soldering head.

All soldering operations are generally performed manually. The wire is firstly inserted into one corresponding insertion hole in the circuit board and then is held in the wire insertion hole by an operator with his hand. Thereafter, the wire is soldered onto the circuit board with the soldering head. However, it is very time-consuming to manually insert and hold the wire. Further, only one wire may be held at a time, which reduces the soldering efficiency. In addition, it is impossible for the wire to be accurately held in the wire insertion hole in the circuit board centrally, which may degrade soldering quality.

SUMMARY

A fixation apparatus includes a base, a wire fixing device mounted on the base, and a pressing device mounted on the base. The wire fixing device positions and fixes a wire on a circuit board and includes a fixing frame mounted on the base and a moving unit received in a receiving chamber of the fixing frame. The fixing frame has a first positioning groove. The moving unit is movable between a clamping position and a release position and has a second positioning groove coupled with the first positioning groove. The wire is inserted into a wire insertion hole in the circuit board between the first positioning groove and the second positioning groove when the mobile unit is moved to the release position. The wire is clamped and fixed between the first positioning groove and the second positioning groove when the moving unit is moved to the clamping position.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
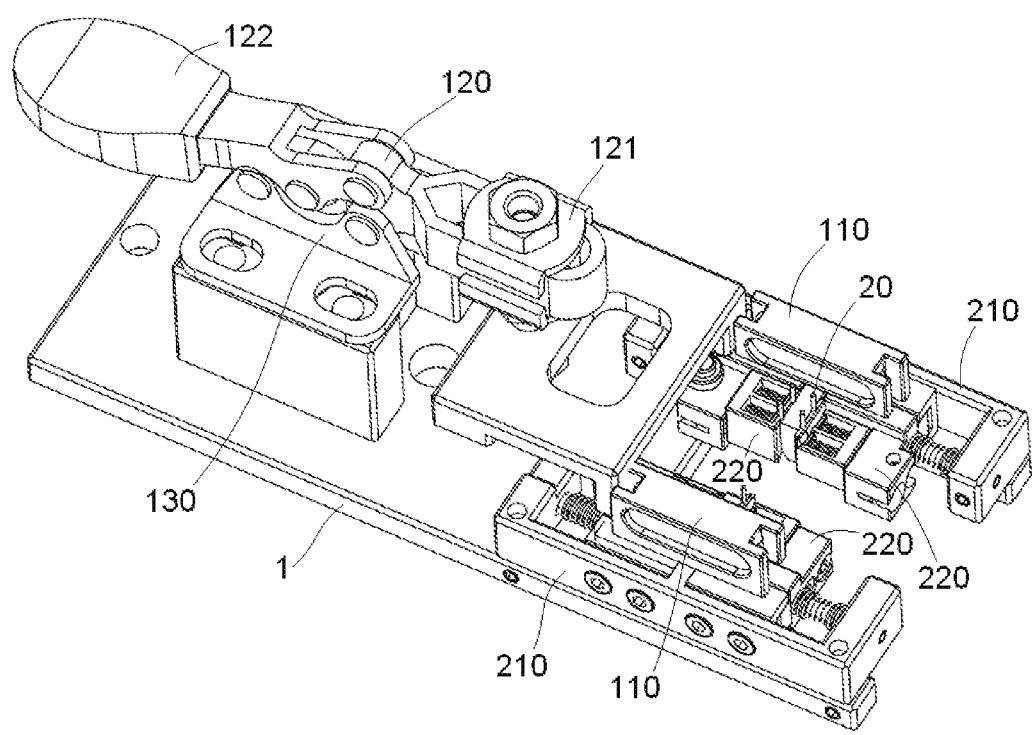
FIG. 1 is a perspective view of a fixation apparatus according to an embodiment.

The technical solution of the disclosure will be described hereinafter in further detail with reference to the following embodiments, taken in conjunction with the accompanying drawings. In the specification, the same or similar reference numerals indicate the same or similar parts. The description of the embodiments of the disclosure hereinafter with reference to the accompanying drawings is intended to explain the general inventive concept of the disclosure and should not be construed as a limitation on the disclosure.

In addition, in the following detailed description, for the sake of explanation, numerous specific details are set forth in order to provide a thorough understanding of the disclosed embodiments. It will be apparent, however, that one or more embodiments may also be practiced without these specific details. In other instances, well-known structures and devices are illustrated schematically in order to simplify the drawing.

Figure 2:
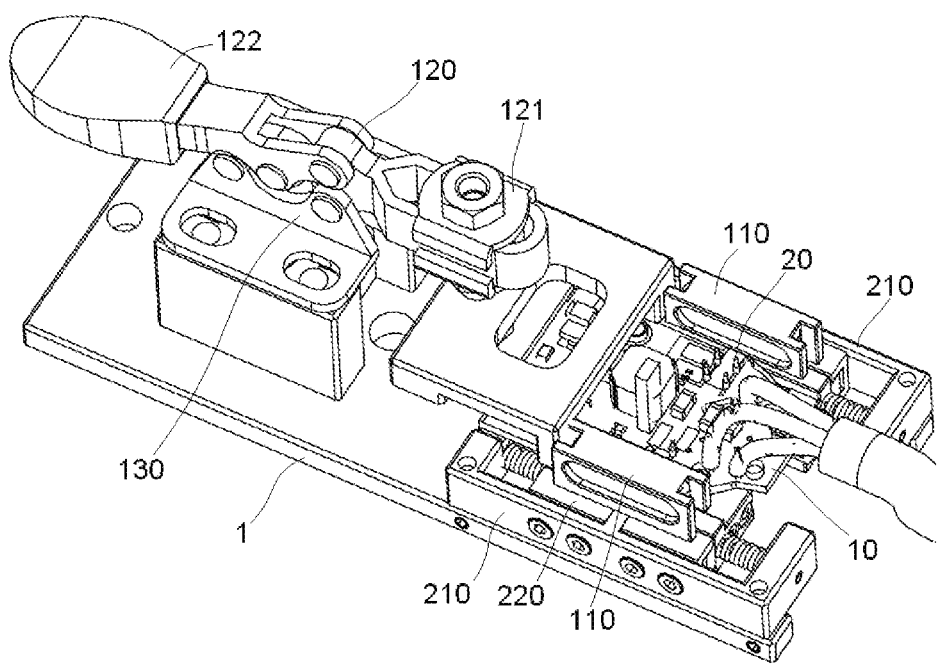
FIG. 2 is a perspective view of the fixation apparatus with a wire and a circuit board.

A fixation apparatus according to an embodiment, as shown in FIGS. 1 and 2, comprises a base 1, a wire fixing device 210, 220 mounted on the base 1 and adapted to position and fix a wire 20 to be soldered on a circuit board 10, and a pressing device 110, 120, 130 mounted on the base 1 and adapted to press the circuit board 10 against the wire fixing device 210, 220.

Figure 3:
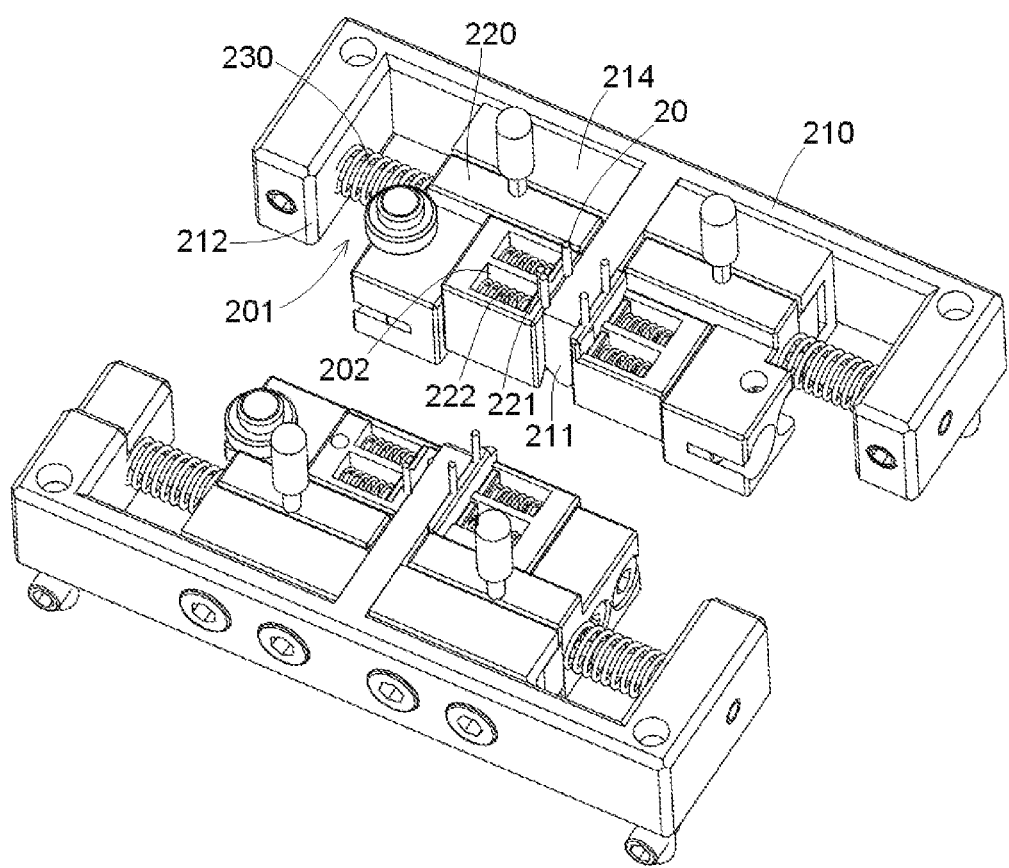
FIG. 3 is a perspective view of a wire fixing device of the fixation apparatus.
Figure 4:
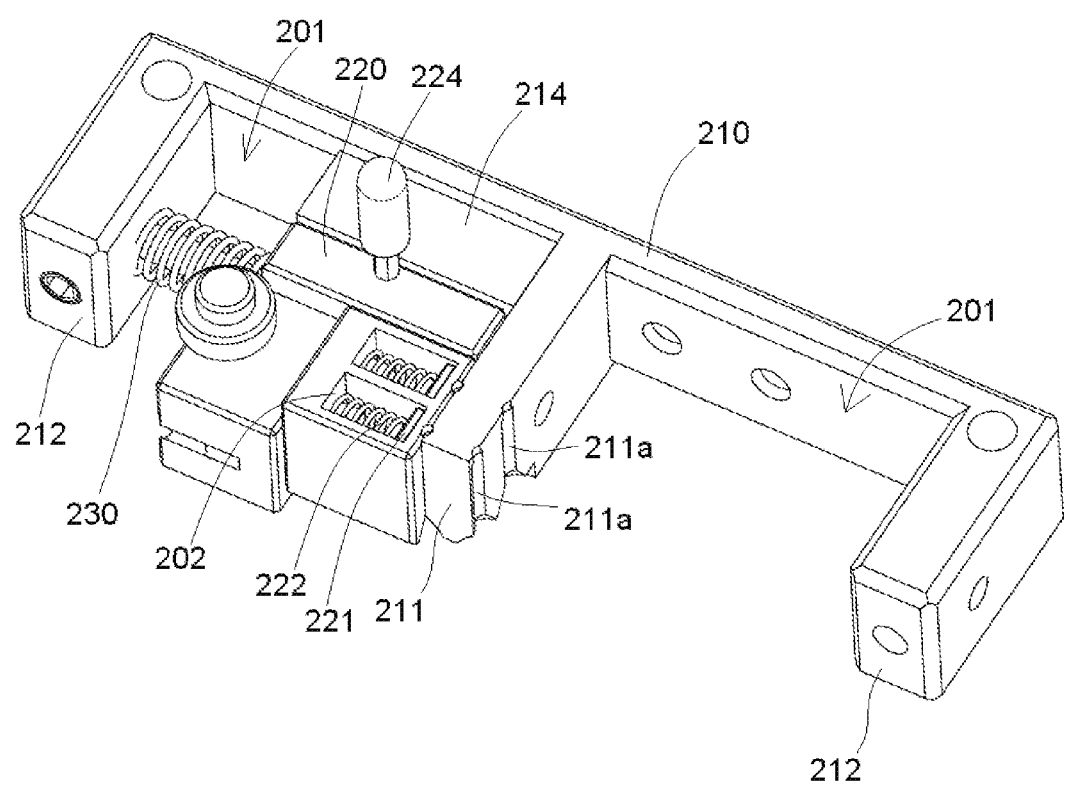
FIG. 4 is a perspective view of a fixing frame and a moving unit of the wire fixing device.

The wire fixing device 210, 220, as shown in FIGS. 2-4, includes a fixing frame 210 fixedly mounted on the base 1, and a moving unit 220, 221, 222, 230 received in a receiving chamber 201 of the fixing frame 210 and movable between a clamping position and a release position.

Figure 5:
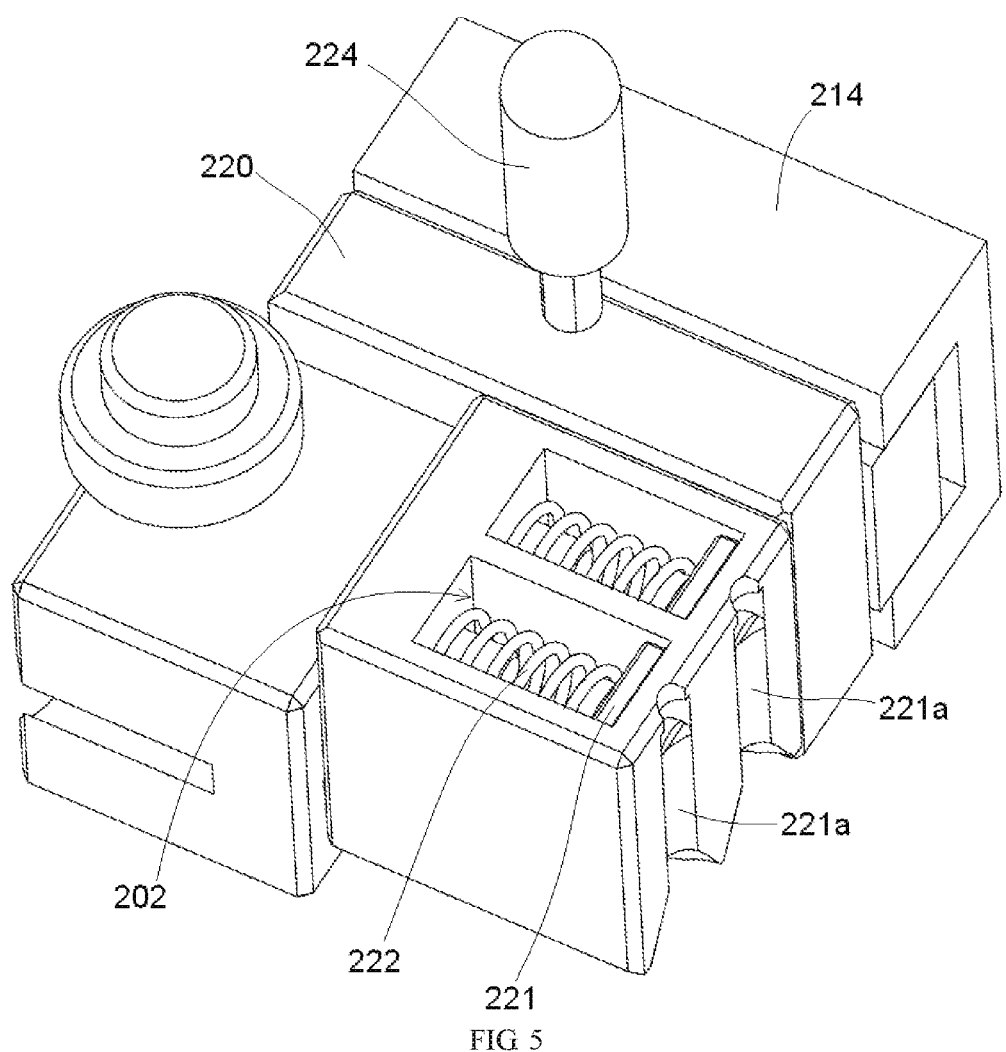
FIG. 5 is a perspective view of the moving unit of the wire fixing device.

The receiving chamber 201 of the fixing frame 210, as shown in FIGS. 3-5, has a first positioning groove 211a in a first side wall 211. The moving unit 220, 221, 222, 230 has a second positioning groove 221a coupled with the first positioning groove 211a. The wire 20 is inserted into a wire insertion hole in the circuit board 10, which is located between the first positioning groove 211a and the second positioning groove 211a when the moving unit 220, 221, 222, 230 is moved to the release position. The wire 20 inserted into the wire insertion hole may be clamped and fixed between the first positioning groove 211a and the second positioning groove 221a when the moving unit 220, 221, 222, 230 is moved to the clamping position, as shown in FIG. 3.

As shown in FIG. 2, when the circuit board 10 is pressed against the wire fixing device 210, 220, a central axis of the wire insertion hole in the circuit board 10 is aligned with the first positioning groove 211a so that the wire 20 inserted into the wire insertion hole is centrally positioned within the wire insertion hole of the circuit board 10.

In an embodiment, the first positioning groove 211a has an insertion port at which a blocking structure for blocking insertion of an outer insulation layer of the wire 20 is formed to control a depth of the wire 20 inserted into the wire insertion hole of the circuit board 10. In this way, it is possible to accurately control a distance between an end surface of an outer insulation layer of the wire 20 and a surface of the circuit board 10.

As shown in FIGS. 4 and 5, the moving unit 220, 221, 222, 230 includes a slider 220, a first spring 230, a slide plate 221, and a second spring 222. The slider 220 is slidably mounted onto the fixing frame 210 and is slidable between the clamping position and the release position. The first spring 230 is disposed between the slider 220 and a second side wall 212 of the receiving chamber 201 opposite to the first side wall 211. The first spring 230 is adapted to push the slider 220 to the clamping position. The slide plate 221 is slidably mounted in an accommodation cavity 202 of the slider 220, and the second positioning groove 221a is formed on the slide plate 221. The second spring 222 is received in the accommodation cavity 202 of the slider 220 and is adapted to push the slide plate 221 against the wire 20. In the embodiment shown in FIG. 5, a connection passage is formed in the first side wall 211 to communicate the second positioning groove 221a and the accommodation cavity 202, so that a part of the slide plate 221 protrudes into the second positioning groove 221 to hold the wire 20 in a space defined by the first positioning groove 211a and the second positioning groove 221a.

As shown in FIGS. 3-5, when the slider 220 is pushed to the clamping position by the first spring 230, the sliding plate 221 may be pushed against the wire 20 by the second spring 222 so that the wire 20 may be clamped and fixed between the first positioning groove 211a and the second positioning groove 221a. The slider 220 has an operating handle 224, by which the slider 220 may be driven manually, against an elastic force of the first spring 230, to move from the clamping position to the release position. A slide rail 214 is mounted on an inner wall of the receiving chamber 201 of the fixing frame 210; the slider 220 is slidably mounted on the slide rail 214.

The wire fixing device 210, 220, as shown in FIGS. 3-5, includes a plurality of fixing frames 210, each of which is formed with a plurality of receiving chambers 201 therein. One moving unit 220, 221, 222, 230 is received in each of the receiving chambers 201. Each receiving chamber 201 of the fixing frame 210 of the wire fixing device 210, 220 has an open side from which the wire 20 soldered into the wire insertion hole of the circuit board 10 may be removed. Each of the fixing frames 210 has a substantial E-shape, and the first positioning groove 211a is formed on the first side wall 211 in the middle of the E-shaped fixing frame 210. The first side wall 211 of each receiving chamber 201 may be formed with one or more first positioning grooves 211a.

As shown in FIGS. 1 and 2, the circuit board 10 is pressed against a top surface of the fixing frame 210 of the wire fixing device 210, 220. The pressing device 110, 120, 130 includes a circuit board carrier 110 on which the circuit board 10 is loaded, a support frame 130 fixedly mounted on the base 1, and a lever mechanism 120 pivotally mounted on the support frame 130. The lever mechanism 120 has a first end 121 connected to the circuit board carrier 110 and a second end with a driving handle 122. The circuit board 10 may be pressed against the top surface of the fixing frame 210 of the wire fixing device 210, 220 by applying a downward pressing force to the circuit board carrier 110 through the drive handle 122.

A soldering method according to an embodiment includes the steps of:

S100: providing the fixation apparatus as described above;

S200: pressing the circuit board 10 against the wire fixing device 210, 220 with the pressing device 110, 120, 130;

S300: moving the moving unit 220, 221, 222, 230 to the release position;

S400: inserting the wire 20 into the wire insertion hole in the circuit board 10 between the first positioning groove 211a and the second positioning groove 221a of the wire fixing device 210, 220;

S500: moving the moving unit 220, 221, 222, 230 to the clamping position so as to clamp and fix the wire 20 inserted into the wire insertion hole between the first positioning groove 211a and the second positioning groove 221a;

S600: soldering the wire 20 inserted into the wire insertion hole to the circuit board 10 with a soldering head (for example, an iron or laser soldering head); and S700: moving the moving unit 220, 221, 222, 230 to the release position and removing the soldered wire 20 from the wire fixing device 210, 220.

It should be appreciated by those skilled in this art that the above embodiments are intended to be illustrative, and many modifications may be made to the above embodiments by those skilled in this art, and various structures described in various embodiments may be freely combined with each other without conflicting in configuration or principle.

Although the disclosure has been described in detail with reference to the attached drawings, it should be appreciated that the disclosed embodiments in the attached drawings are intended to illustrate the embodiments of the disclosure by way of example, and should not be construed as limitation to the disclosure.

Although several exemplary embodiments of the general concept of the disclosure have been shown and described, it would be appreciated by those skilled in the art that various changes or modifications may be made to these embodiments without departing from the principles and spirit of the general concept of the disclosure, the scope of which is defined by the claims and their equivalents.

What is claimed is:

1. A fixation apparatus, comprising:
a base;
a wire fixing device mounted on the base, the wire fixing device positions and fixes a wire to be soldered on a circuit board and includes a fixing frame mounted on the base and a moving unit received in a receiving chamber of the fixing frame, the fixing frame having a first positioning groove in a first side wall, the moving unit movable between a clamping position and a release position and having a second positioning groove coupled with the first positioning groove, the wire is inserted into a wire insertion hole in the circuit board between the first positioning groove and the second positioning groove when the moving unit is moved to the release position, and the wire inserted into the wire insertion hole is clamped and fixed between the first positioning groove and the second positioning groove when the moving unit is moved to the clamping position; and
a pressing device mounted on the base and adapted to press the circuit board against the wire fixing device.

2. The fixation apparatus of claim 1, wherein, when the circuit board is pressed against the wire fixing device, a central axis of the wire insertion hole in the circuit board is aligned with the first positioning groove so that the wire inserted into the wire insertion hole is centrally positioned within the wire insertion hole.

3. The fixation apparatus of claim 2, wherein the first positioning groove has an insertion port with a blocking structure blocking insertion of an outer insulation layer of the wire, the blocking structure controlling a depth of the wire inserted into the wire insertion hole.

4. The fixation apparatus of claim 1, wherein the moving unit includes a slider slidably mounted onto the fixing frame and slidable between the clamping position and the release position.

5. The fixation apparatus of claim 4, wherein the moving unit includes a first spring disposed between the slider and a second side wall of the receiving chamber opposite to the first side wall, the first spring adapted to push the slider to the clamping position.

6. The fixation apparatus of claim 5, wherein the moving unit includes a slide plate slidably mounted in an accommodation cavity of the slider, the second positioning groove is formed on the slide plate.

7. The fixation apparatus of claim 6, wherein the moving unit includes a second spring received in the accommodation cavity of the slider and adapted to push the slide plate against the wire.

8. The fixation apparatus of claim 7, wherein, when the slider is pushed to the clamping position by the first spring, the slide plate is pushed against the wire by the second spring so that the wire is clamped and fixed between the first positioning groove and the second positioning groove.

9. The fixation apparatus of claim 8, wherein the slider has an operating handle by which the slider is driven against an elastic force of the first spring to move from the clamping position to the release position.

10. The fixation apparatus of claim 8, wherein the fixing frame has a slide rail mounted on an inner wall of the receiving chamber, the slider slidably mounted on the slide rail.

11. The fixation apparatus of claim 8, wherein the wire fixing device includes a plurality of fixing frames each having a plurality of receiving chambers, each of the receiving chambers receives one moving unit.

12. The fixation apparatus of claim 11, wherein each receiving chamber of has an open side from which the wire soldered into the wire insertion hole of the circuit board is removed.

13. The fixation apparatus of claim 12, wherein each of the fixing frames has an E-shape, the first positioning groove is formed on the first side wall in a middle of the E-shape.

14. The fixation apparatus of claim 12, wherein the first side wall of each receiving chamber has at least one first positioning groove.

15. The fixation apparatus of claim 1, wherein the circuit board is pressed against a top surface of the fixing frame.

16. The fixation apparatus of claim 15, wherein the pressing device includes a circuit board carrier on which the circuit board is loaded, a support frame fixedly mounted on the base, and a lever mechanism pivotally mounted on the support frame, the lever mechanism has a first end connected to the circuit board carrier and a second end with a driving handle.

17. The fixation apparatus of claim 16, wherein the circuit board is pressed against the top surface of the fixing frame by applying a downward pressing force to the circuit board carrier through the driving handle.

18. A soldering method, comprising:
providing a fixation apparatus including a base, a wire fixing device mounted on the base, and a pressing device mounted on the base, the wire fixing device positions and fixes a wire to be soldered on a circuit board and includes a fixing frame mounted on the base and a moving unit received in a receiving chamber of the fixing frame, the fixing frame having a first positioning groove in a first side wall, the moving unit movable between a clamping position and a release position and having a second positioning groove coupled with the first positioning groove;
pressing the circuit board against the wire fixing device with the pressing device;
moving the moving unit to the release position;
inserting the wire into the wire insertion hole in the circuit board between the first positioning groove and the second positioning groove of the wire fixing device;
moving the moving unit to the clamping position so as to clamp and fix the wire inserted into the wire insertion hole between the first positioning groove and the second positioning groove;
soldering the wire inserted into the wire insertion hole to the circuit board with a soldering head; and
moving the moving unit to the release position and removing the soldered wire from the wire fixing device.

* * * * *